(12) United States Patent
Zeiler

(10) Patent No.: US 6,930,042 B1
(45) Date of Patent: Aug. 16, 2005

(54) METHOD FOR PRODUCING A SEMICONDUCTOR COMPONENT WITH AT LEAST ONE ENCAPSULATED CHIP ON A SUBSTRATE

(75) Inventor: Thomas Zeiler, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/568,945

(22) Filed: May 11, 2000

(30) Foreign Application Priority Data

May 11, 1999 (DE) ................................ 199 21 867

(51) Int. Cl.⁷ .................. H01L 21/44; H01L 21/48; H01L 21/50; H01L 23/48; H01L 23/52
(52) U.S. Cl. ................. 438/666; 438/125; 438/126; 438/669; 257/692; 257/773
(58) Field of Search .................. 438/112, 123, 618, 438/666, 692, 125–127, 669, 616; 257/670, 257/692, 773; 29/827, 854–55, 829, 832, 29/842, 846, 855, 856

(56) References Cited

U.S. PATENT DOCUMENTS

| | | | | |
|---|---|---|---|---|
| 4,504,435 A | * | 3/1985 | Orcutt | .......................... 264/272 |
| 5,026,669 A | | 6/1991 | Shinohara | |
| 5,137,479 A | | 8/1992 | Ohikata et al. | |
| 5,147,815 A | * | 9/1992 | Casto | |
| 5,348,792 A | * | 9/1994 | Hattori et al. | ............... 428/209 |
| 5,360,991 A | * | 11/1994 | Abys et al. | .................. 257/666 |
| 5,424,577 A | | 6/1995 | Suzuki et al. | |
| 5,455,199 A | * | 10/1995 | Sakamoto | ..................... 437/207 |
| 5,739,588 A | * | 4/1998 | Ishida et al. | ................. 257/782 |
| 5,904,506 A | | 5/1999 | Yoneda et al. | |
| 6,130,478 A | * | 10/2000 | Dumoulin et al. | ........... 257/728 |
| 6,335,225 B1 | * | 1/2002 | Doan | .......................... 438/123 |

FOREIGN PATENT DOCUMENTS

| | | | |
|---|---|---|---|
| DE | 30 40 676 A1 | 5/1982 | |
| DE | 1584 45 | 1/1983 | |
| JP | 4-18399 | * 1/1992 | .......... B42D 15/10 |
| JP | 0080045976 AA | 2/1996 | |

OTHER PUBLICATIONS

Published International Application No. WO 95/32520 (Tanaka), dated Nov. 30, 1995 and English Abstract.
"Kraftpaket, Tools und Technologie für Chip- und Leiterplattenhersteller", dated Nov. 4, 1998, Elektronikpraxis No. 21, pp. 60-63.

* cited by examiner

*Primary Examiner*—Craig A. Thompson
*Assistant Examiner*—Nema Berezny
(74) *Attorney, Agent, or Firm*—Laurence A. Greenberg; Werner H. Stemer; Ralph E. Locher

(57) ABSTRACT

A method for producing a semiconductor component includes coating a substrate with a metalization. The metalization is structured in such a way that interconnects are formed at least in an encapsulation region. An encapsulation is applied in the encapsulation region around a previously applied chip. In order to provide sealing during the application of the encapsulation, either the interconnects are structured in such a way that they are interconnected, or a labyrinth structure is formed between the interconnects.

3 Claims, 5 Drawing Sheets

METHOD FOR PRODUCING A SEMICONDUCTOR COMPONENT WITH AT LEAST ONE ENCAPSULATED CHIP ON A SUBSTRATE

BACKGROUND OF THE INVENTION

Field of the Invention

The present invention relates to a method for producing a semiconductor component with an encapsulated chip on a substrate. Such semiconductor components may be constructed, for example, as BGA (Ball Grid Array) components, PGA (Pin Grid Array) components, CSP (Chip Scale Packaging) components or the like. An alternative construction is described in an article entitled "Kraftpaket", in Elekronikpraxis No. 21, Nov. 4, 1998, pages 60 to 63, wherein a PSGA (Polymer Stud Grid Array) component is presented in which a semiconductor chip is disposed on a polymer plastic substrate. That substrate can be produced in a precision injection-molding process. A conductive connection to a printed circuit board is produced by integrally formed pins (studs).

FIG. 1 diagrammatically illustrates a semiconductor component according to one of the types described above, in which a semiconductor chip enclosed by an encapsulation 6 is disposed on a substrate 1. The encapsulation can be produced by customary methods such as molding, gobe top methods, or the like. Interconnects 5 lead from the encapsulation 6 on the surface of the substrate. The interconnects are in turn conductively connected to elevations 11 on the underside of the substrate 1. The elevations 11 serve to make contact with a printed circuit board. The interconnects 5 on the top side of the substrate 1 are generally produced by coating the substrate with a metalization layer and subsequently structuring or patterning the metalization. The interconnects thus form elevated structures on the substrate, as is illustrated in an enlarged view in FIG. 2.

It is problematic in such a case that interspaces between the interconnects are inadequately sealed during molding encapsulation of the semiconductor chip in order to form the encapsulation. That sealing is necessary for the following reason: A tool used to effect molding encapsulation, with a cavity that it contains in order to accommodate a molding compound, must bear on the substrate surface in a planar manner and a contact pressure with which the tool is pressed onto the substrate surface must be able to seal the cavity, in order to ensure that no molding compound can escape from the cavity at a customary molding-encapsulation pressure of from 60 to 100 bar. Those regions at which an uneven substrate surface is present are then problematic. The consequence thereof, as is shown in FIG. 2, is that part of the molding compound escapes from the encapsulation region between the interconnects and leads to contamination of the substrate surface. In the extreme case, that can even make it impossible to encapsulate the component by molding. To date, the customary procedure for sealing those openings has been to provide a solder resist on the substrate 1 and thus between the interconnects as well. However, that requires an additional work step, as a result of which the method for producing the semiconductor component is prolonged and made more expensive.

SUMMARY OF THE INVENTION

It is accordingly an object of the invention to provide a method for producing a semiconductor component with at least one encapsulated chip on a substrate, which overcomes the hereinafore-mentioned disadvantages of the heretofore-known methods of this general type, which is simple and in which tightness in an encapsulation region is guaranteed.

With the foregoing and other objects in view there is provided, in accordance with the invention, a method for producing a semiconductor component, which comprises providing a substrate having an encapsulation region and a chip mounting location in the encapsulation region; coating the substrate with a metalization or metalization layer; structuring or patterning the metalization to form interconnects at least in the encapsulation region, the interconnects having chip contact-making locations in the encapsulation region and the interconnects connected to each other outside the encapsulation region; applying at least one chip to the chip mounting location and connecting the chip to the chip contact-making locations; applying an encapsulation in the encapsulation region around the chip; and structuring the metalization outside the encapsulation region to form mutually separate interconnects.

With the objects of the invention in view, there is also provided a method for producing a semiconductor component, which comprises providing a substrate having an encapsulation region and a chip mounting location in the encapsulation region; coating the substrate with a metalization or a metalization layer; structuring or patterning the metalization to form interconnects at least in the encapsulation region, the interconnects having chip contact-making locations in the encapsulation region and the interconnects each forming a labyrinth structure with adjacent interconnects outside the encapsulation region; applying at least one chip to the chip mounting location and connecting the chip to the chip contact-making locations; and applying an encapsulation in the encapsulation region around the chip.

First of all, a substrate is provided, and the substrate is then coated with a metalization. In this case, the material used for the metalization may, for example, be copper or a refined copper carrier layer. The metalization is then patterned or structured, in such a way that a chip mounting location, chip contact-making locations and outwardly leading interconnects are formed at least in the encapsulation region. In principle, interconnects outside the encapsulation region may already be patterned or structured as well in this method step. However, this is not yet absolutely necessary. At least one semiconductor chip is subsequently emplaced on the chip mounting location within the encapsulation region. The conductive connection between the interconnects and the semiconductor chip is established through the chip contact-making locations.

In this method step, the metalization is patterned or structured in such a way that the interconnects leading from the chip contact-making locations to the edge of the encapsulation region are interconnected outside the encapsulation region.

In accordance with another mode of the invention, this connection may be effected, for example, in the form of narrow webs, but it may also be effected by large-area regions of the metalization having an extent which may be greater than that of the interconnects themselves.

After the at least one chip has been applied on the chip mounting location and contact has been made with the chip through the use of the chip contact-making locations, the chip is encapsulated by molding through the use of a plastic encapsulation in the encapsulation region. In this case, the molding encapsulation is generally effected by transfer molding, wherein molding-encapsulation pressures (generally in the range of from 60 to 100 bar) necessitate sealing between the tool with the cavity and the substrate surface, i.e. it is necessary to ensure a plane surface in the region of the entire bearing area of the tool. The tightness between the interconnects in this case is guaranteed by the connections between the interconnects outside the encapsulation region.

In accordance with a further mode of the invention, after the encapsulation has been pressed on, the next step is that of structuring the metalization outside the encapsulation region in such a way that mutually separate interconnects are formed. If, by way of example, only webs were left between the interconnects before the encapsulation is pressed on, then these webs between the interconnects are removed after the pressing on-process. The provision of webs between leads is already known, in principle, for lead frames. In this respect, reference is made to U.S. Pat. No. 5,424,577, for example. However, the present invention relates to the structuring of a metalization in order to form interconnects on a substrate, where the formation of the interconnects can advantageously be combined with the formation of the sealing between the interconnects.

In principle, the regions for effecting sealing between the interconnects in this case may be patterned or structured in any desired form, that is to say not only as webs but also as large-area regions. However, it may also be provided that the interconnects are not interconnected, but instead a labyrinth structure effects the sealing between the interconnects.

In accordance with an added mode of the invention, in the case of a labyrinth structure, either the interconnects are patterned or structured in their entirety in such a way that they yield a labyrinth structure, e.g. as meandering interconnects, or extensions proceeding from largely rectilinearly patterned or structured interconnects are provided. The extensions extend a certain distance in the direction of the adjacent interconnects, but without directly adjoining them. In this case, the extensions are each disposed offset along two adjacent interconnects. The distance between the extensions is chosen to be small enough, and the number of extensions is chosen to be large enough, in a manner dependent on the molding-encapsulation pressure and the viscosity of the molding compound, to ensure that the molding compound can be prevented from escaping.

In the extreme case, it may even be provided that the interconnects are patterned or structured outside the encapsulation region only after the encapsulation of the at least one semiconductor chip. As a result, the sealing of the encapsulation region is automatically obtained. A separate step for removing the sealing elements can thus be dispensed with precisely in the latter case.

In accordance with an additional mode of the invention, the structuring of the metalization and thus the production of the interconnects, on one hand, as well as the removal of the connections between the interconnects, on the other hand, can be carried out by any suitable process, for example through the use of a laser, etching technique, mechanical processing or the like. These steps are entirely obviated when labyrinthine sealing is used.

In accordance with a concomitant mode of the invention, in this case, the semiconductor component can be constructed as a BGA (Ball Grid Array) component, PGA (Pin Grid Array) component, SGA (Stud Grid Array) component, or the like. The substrate which is used may, for example, be a ceramic substrate, a film, e.g. polyamide, or a laminate substrate, or, as in the SGA for example, preferably a polymer substrate.

Other features which are considered as characteristic for the invention are set forth in the appended claims.

Although the invention is illustrated and described herein as embodied in a method for producing a semiconductor component with at least one encapsulated chip on a substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
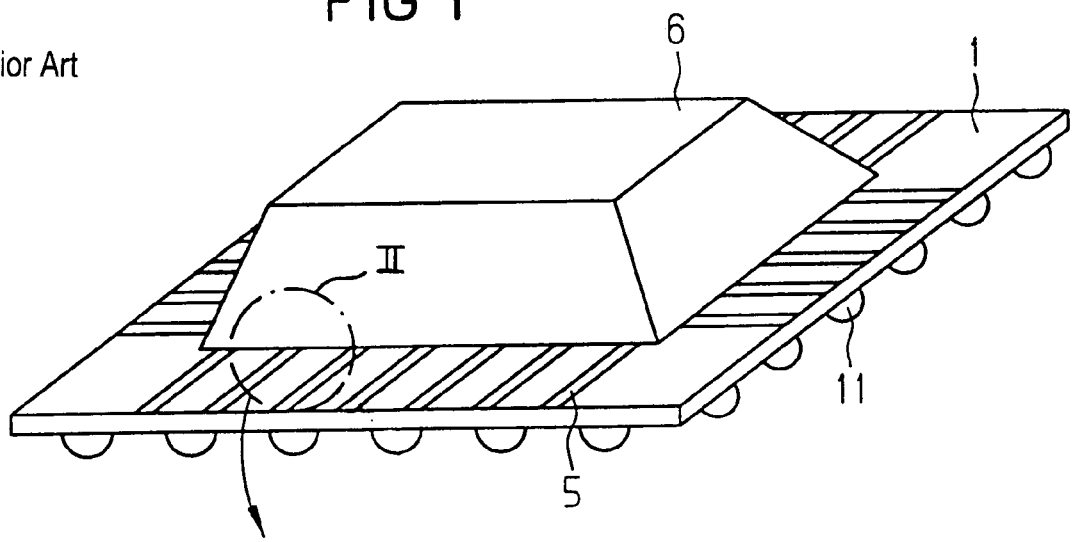
FIG. 1 is a diagrammatic, perspective view of a semiconductor component with an encapsulated chip on a substrate according to the prior art.
Figure 2:
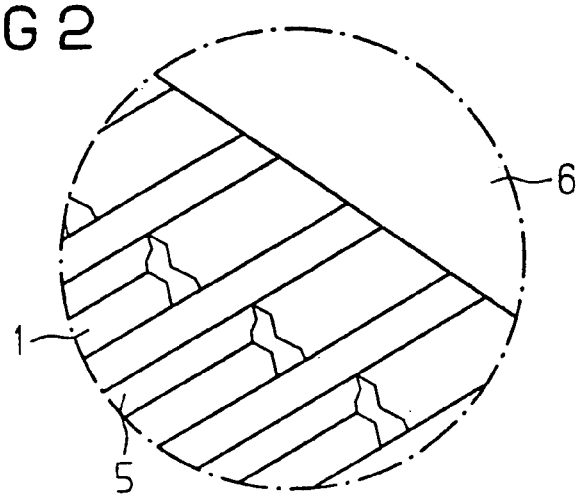
FIG. 2 is an enlarged, fragmentary, perspective view of a portion II of FIG. 1 at an edge of an encapsulation region with molding compound escaping in the absence of sealing between interconnects.
Figure 3A:
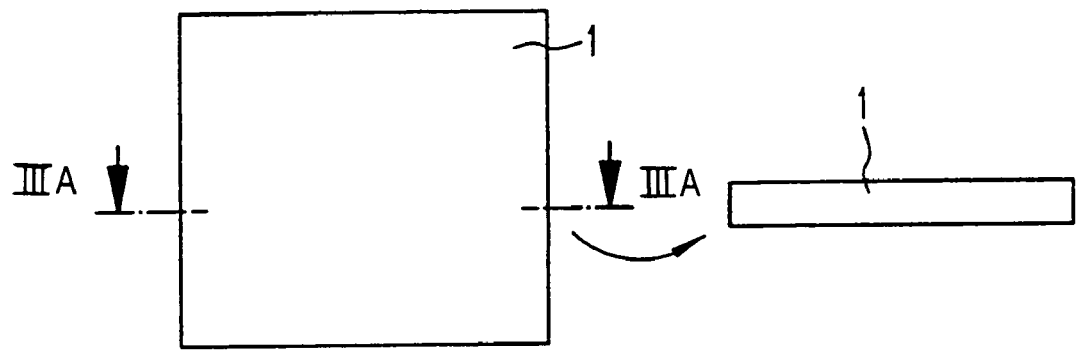
FIGS. 3A–3F are plan and sectional views illustrating method steps according to the invention for producing a semiconductor component.

Referring now to the figures of the drawings in detail and first, particularly, to FIG. 1 thereof, there is seen a semiconductor component according to the prior art, as already described in the introduction. In that component, a chip is enclosed by an encapsulation 6 on a substrate 1 and interconnects 5 are provided on a front side of the substrate 1. The interconnects 5 lead through the substrate 1 to elevations 11 on a rear side of the substrate 1 through non-illustrated plated-through holes, for example. In order to prevent molding compound from escaping between the interconnects 5 in a manner illustrated in FIG. 2, steps illustrated in FIGS. 3A to 3F are carried out according to the invention:

First of all, a substrate 1 is provided, as is shown in principle in FIG. 3A. A right-hand part of FIG. 3A shows a cross section through the substrate 1 which is taken along a line IIIA—IIIA, in the direction of the arrows.

Figure 3B:
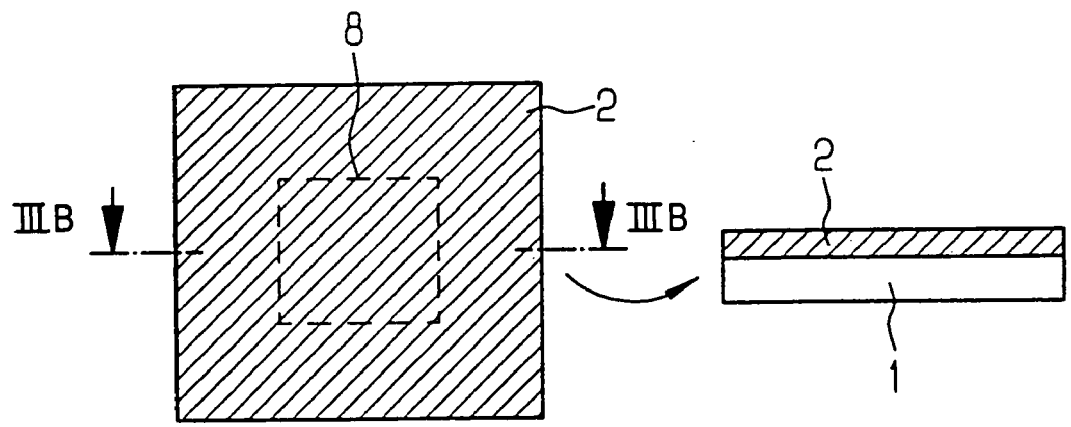

As is illustrated in FIG. 3B, the substrate 1 is then coated with a metalization 2. The latter may be composed of copper or a refined copper carrier. In this case, the coating is effected over the whole area of an upper surface of the substrate 1. A subsequent encapsulation region 8 is illustrated in the form of a dashed line in FIG. 3B.

Figure 3C:
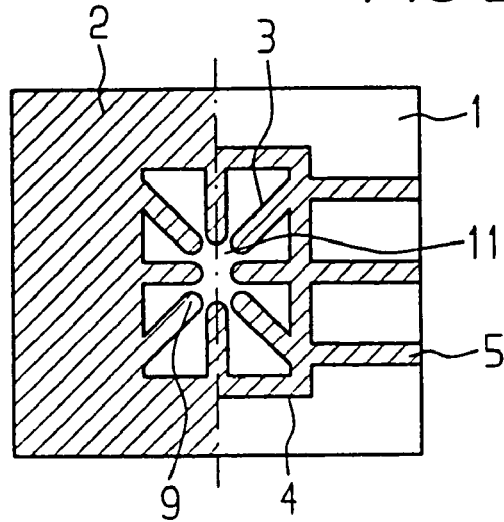
Figure 3D:
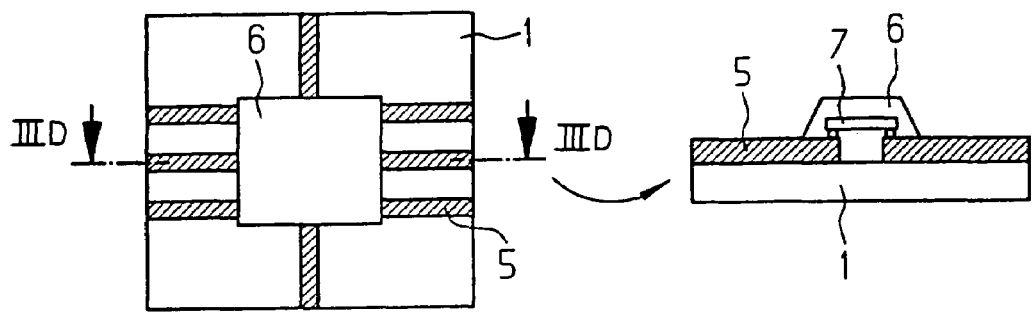
Figure 3E:
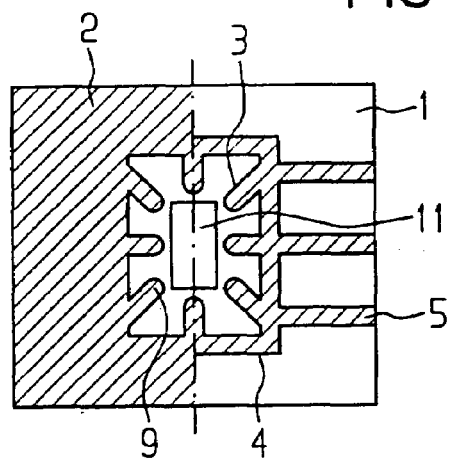

Interconnects 3 are then patterned in the encapsulation region 8, as is shown by FIGS. 3C and 3E and chip contact-making locations 9 are formed at ends of the interconnects in the encapsulation region 8, by using an etching technique or a laser (e.g. in the case of PSGA). A chip mounting location 11 bounded by the chip contact-making locations 9 is generally provided in the center of the encapsulation region 8. In the case of FIGS. 3C and 3D, a semiconductor chip is mounted directly on the chip contact-making locations 9 in the form of flip-chip mounting.

As is illustrated by the left-hand part of FIGS. 3C and 3E, the interconnects may be initially patterned only in the encapsulation region 8, whereas the metalization 2 is not patterned outside the encapsulation region 8. Sealing of the encapsulation region 8 is thus achieved automatically, as a result of which the molding compound can later be prevented from escaping between the external interconnects 5. However, webs 4 may be provided between the interconnects 3, 5 at the edge of the encapsulation region 8, as is shown by the right-hand part of FIGS. 3C and 3E, as a result of which the interconnects 3, 5 are interconnected. In the remaining region outside the encapsulation region 8, the external interconnects 5 which establish the conductive connection to the elevations 11 on the underside of the substrate 1 are already patterned. In this case, the webs 4 between the interconnects 5 merely have to be removed after the application of the encapsulation 6 on the encapsulation region 8. This can likewise be done by using a laser. In the first case, the metalization 2 is patterned to form external interconnects 5 outside the encapsulation region 8 only after the application of the encapsulation 6.

Proceeding from the interconnects 5, it is possible, as required, to provide conductive connections to the opposite side of the substrate 1. This may be done, for example, through the use of plated-through holes (through holes) through the substrate 1 or through the use of routing interconnects around the edge of the substrate (e.g. in the case of PSGA).

FIG. 3D shows the semiconductor component after application of the encapsulation 6 over a semiconductor chip 7, as is illustrated in the right-hand part of FIG. 3D, which is a cross section taken along a line III—IIID, in the direction of the arrows. The interconnects 5 outside the encapsulation region 8 are already completely patterned and the connections between the interconnects 5 have been removed.

Figure 3F:
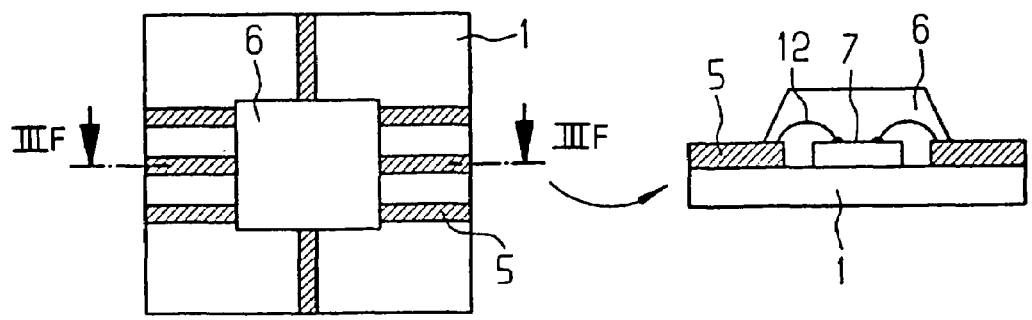

FIGS. 3E and 3F illustrate another customary manner of making contact with a chip, in which the semiconductor chip 7 is mounted on a chip mounting location 11 surrounded by chip contact-making locations 9, as is shown by FIG. 3E. The chip 7 is thus mounted onto the substrate 1 between the chip contact-making locations 9 and connected to the chip contact-making locations 9 through wires 12, as is illustrated in FIG. 3F.

Figure 4A:
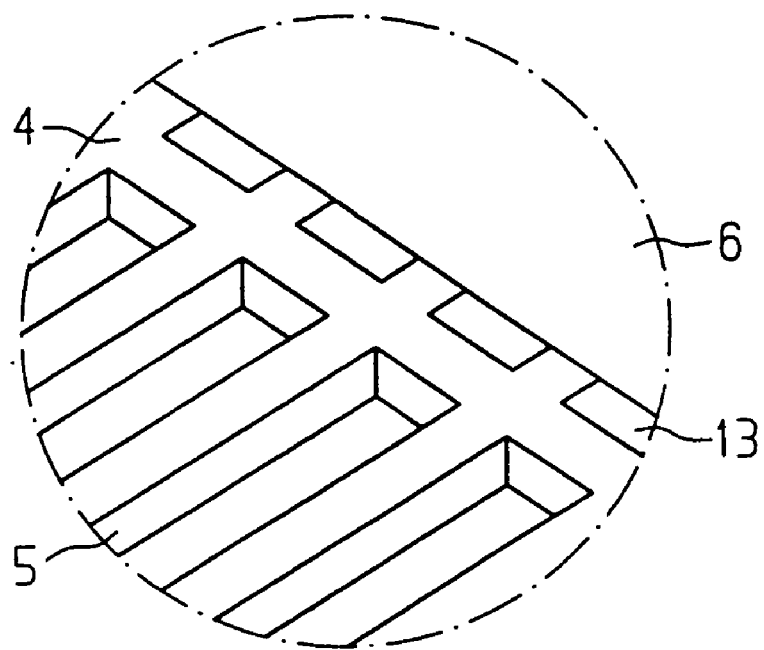
FIGS. 4A and 4B are enlarged, fragmentary, perspective views of connections between the interconnects in the form of webs, according to the invention.
Figure 4B:
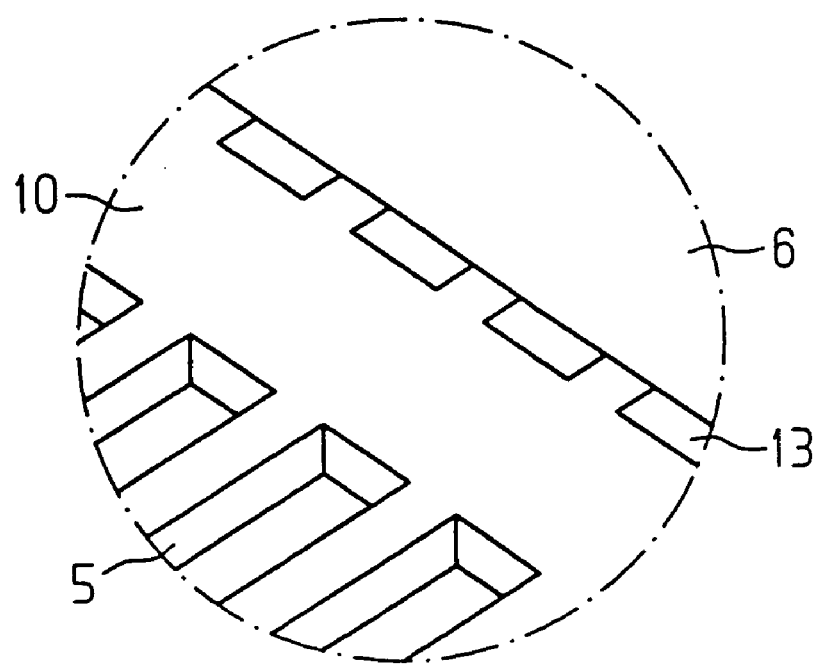

FIG. 4A is an enlarged illustration once again showing connections between the interconnects 5 at the edge of the encapsulation region 8, wherein the encapsulation 6 has already been pressed on. The connections between the interconnects 5 in this case are constructed as webs 4, which prevent a portion 13 of the molding compound that is situated between the interconnects from escaping. Instead of webs 4, however, it is also possible to provide large-area regions 10 between the interconnects 5 which, by way of example, may have a width that is larger than the width of the interconnects 5. This alternative is illustrated diagrammatically in FIG. 4B. The large-area regions 10 have a larger extent in the direction toward the edge of the substrate than the width of the interconnects 5 in a cross section perpendicular to their longitudinal direction.

Figure 5:
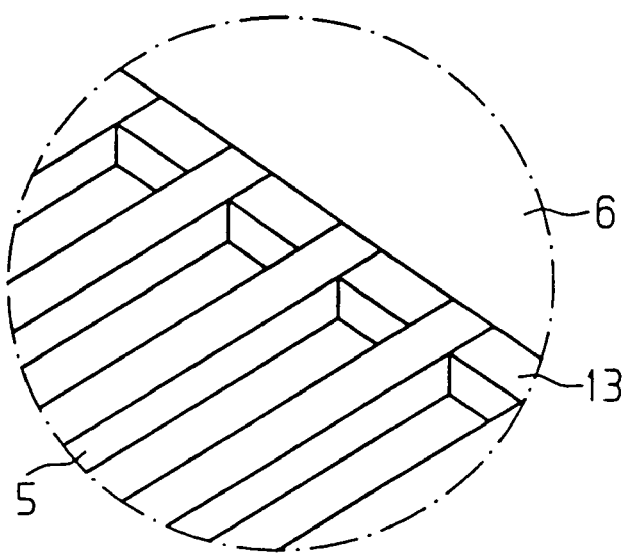
FIG. 5 is an enlarged, fragmentary, perspective view the edge of the encapsulation region after removal of the connections between the interconnects.

FIG. 5 shows the semiconductor component after the removal of the connections between the interconnects 5. It has been possible to effectively prevent escape of the portion 13 of the molding compound during the production of the encapsulation 6 between the interconnects 5. The extent of the molding compound is thus restricted to the encapsulation region 8.

Figure 6:
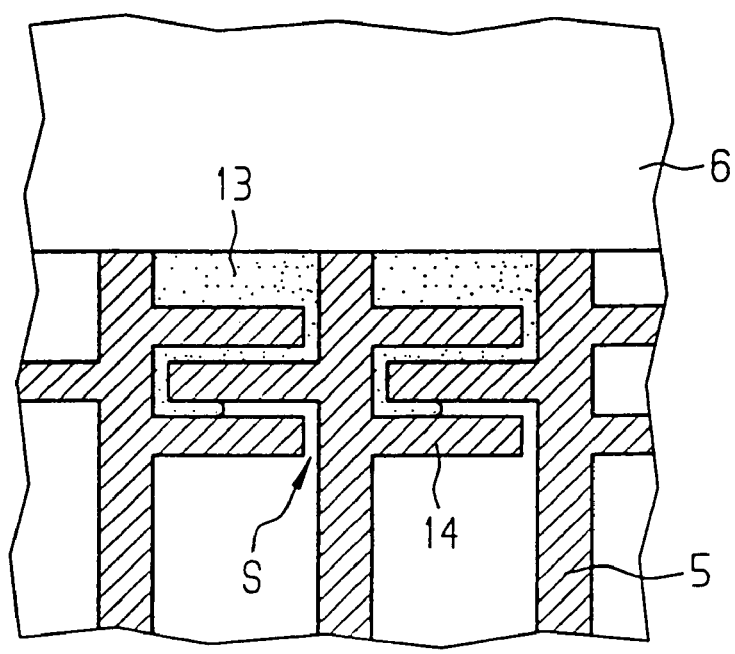
FIG. 6 is an enlarged, fragmentary, plan view of a labyrinth structure between the interconnects, according to the invention.

FIG. 6 illustrates an alternative to the connecting webs 4 and the regions 10. In this case, the interconnects 5 are not connected to one another. Instead, a labyrinth structure is formed between the individual interconnects 5 through the use of extensions 14 in the form of webs. The extensions 14 may also have another suitable form. The interconnects 5 may also be constructed in a meandering manner in their entirety. All that is important is that there be a gap S between the interconnects 5 and the extensions 14. The gap dimension and the number of its convolutions is adapted to the molding-encapsulation pressure and viscosity of the molding compound. This is done in such a way that, during molding encapsulation, that portion 13 of the molding compound which is situated between the interconnects 5 cannot escape from the labyrinth structure. This is illustrated diagrammatically in FIG. 6.

I claim:

1. A method for producing a semiconductor component, which comprises the steps of:
   providing a polymer stud grid array substrate, the substrate having an encapsulation region and a chip mounting location in the encapsulation region;
   coating the substrate with a metalization or metalization layer;
   structuring or patterning the metalization or metalization layer with a laser radiation to form interconnects at least in the encapsulation region, the interconnects having chip contact-making locations in the encapsulation region and having extensions extending a distance in a direction toward adjacent interconnections without directly adjoining the adjacent interconnections outside the encapsulation region, the distance between the extensions being small enough and a number of the extensions being large enough to inhibit a molding compound for the encapsulation from escaping;
   applying at least one chip to the chip mounting location and connecting the chip to the chip contact-making locations; and
   applying an encapsulation in the encapsulation region around the chip.

2. The method according to claim 1, wherein the extensions from the adjacent interconnects overlap and are parallel to each other without contacting each other.

3. A method for producing a semiconductor component, which comprises the steps of:
   providing a polymer stud grid array substrate, the substrate having an encapsulation region and a chip mounting location in the encapsulation region;
   coating the substrate with a metalization or metalization layer;
   structuring or patterning the metalization or metalization layer with a laser radiation to form interconnects at least in the encapsulation region, the interconnects having chip contact-making locations in the encapsulation region and being formed in a meandering manner outside the encapsulation region to form a labyrinth structure and inhibiting a molding compound flow;
   applying at least one chip to the chip mounting location and connecting the chip to the chip contact-making locations; and
   applying an encapsulation in the encapsulation region around the chip.

* * * * *